United States Patent
Knee et al.

(10) Patent No.: US 6,906,304 B2
(45) Date of Patent: Jun. 14, 2005

(54) PHOTO-SENSOR ARRAY FOR MOTION DETECTION

(75) Inventors: Derek L. Knee, Ft. Collins, CO (US); Thomas C. Oliver, Windsor, CO (US); Gary M. Rensberger, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 312 days.

(21) Appl. No.: 10/305,062

(22) Filed: Nov. 27, 2002

(65) Prior Publication Data

US 2004/0099790 A1 May 27, 2004

(51) Int. Cl.$^7$ ............................................. H01L 27/00
(52) U.S. Cl. ............................... 250/208.1; 250/214.1; 250/214 R; 382/312; 382/313; 348/310; 341/155
(58) Field of Search .......................... 250/208.1, 214.1, 250/214 R; 348/302, 307–310; 341/155; 382/312, 313

(56) References Cited

U.S. PATENT DOCUMENTS

| | | | |
|---|---|---|---|
| 5,461,425 A | | 10/1995 | Fowler et al. |
| 5,801,657 A | | 9/1998 | Fowler et al. |
| 6,172,354 B1 | | 1/2001 | Adan et al. |
| 6,201,573 B1 | * | 3/2001 | Mizuno ........................ 348/308 |
| 6,271,785 B1 | * | 8/2001 | Martin et al. ................ 341/169 |
| 6,303,924 B1 | | 10/2001 | Adan et al. |
| 6,330,030 B1 | * | 12/2001 | O'Connor .................... 348/297 |
| 6,377,303 B2 | * | 4/2002 | O'Connor .................... 348/308 |
| 6,545,624 B2 | * | 4/2003 | Lee et al. ..................... 341/155 |
| 6,667,769 B2 | * | 12/2003 | Harton et al. ................ 348/308 |
| 6,707,410 B1 | * | 3/2004 | Bock ............................ 341/155 |
| 6,741,198 B2 | * | 5/2004 | McIlrath ...................... 341/155 |
| 6,741,283 B1 | * | 5/2004 | Merrill et al. ............... 348/308 |
| 6,757,018 B1 | * | 6/2004 | Fowler ......................... 348/301 |

OTHER PUBLICATIONS

Xavier Arreguit et al., "A CMOS Motion Detector System for Pointing Devices," ISSCC96 Array Processors ad Image Based Sensors, Paper TP 6.4, date unknown, but believed prior to Nov. 27, 2001.

Xavier Arreguit et al., "A CMOS Motion Detector System for Pointing Devices," IEEE J. of Solid State Circuits. vol. 31. No. 12, pp. 1916–1921, Dec. 1996.

Rafael Dominguez–Castro et al., "A 0.8 $\mu$m CMOS Two–Dimensional Programmable Mixed–Signal Focal–Plane Array Processor with On–Chip Binary Imaging and Instructions Storage," IEEE J. of Solid State Circuits, vol. 32, No. 7, pp. 1013–1026, Jul. 1997.

Stuart Kleinfelder et al., "A 10 000 Frames/s CMOS Digital Pixel Sensor," IEEE J. of Solid State Circuits, vol. 36, No. 12, pp. 2049–2059, Dec. 2001.

Nicolo Manaresi et al., "A CMOS–Only Micro Touch Pointer," IEEE J. of Solid State Circuits, vol. 34, No. 12, pp. 1860–1868, Dec. 1999.

(Continued)

Primary Examiner—David Porta
Assistant Examiner—Davienne Monbleau
(74) Attorney, Agent, or Firm—Banner & Witcoff, LTD (57) ABSTRACT

Pixels in an array of image sensor pixels contain photo-sensors and circuits having inputs connected to the photo-sensors. The circuits have feedback loops for reducing fixed pattern noise in the array. Output from each pixel is used to latch a multibit counter value supplied by a global counter. Each feedback loop preferably includes a pair of alternately-toggling switching transistors to minimize unwanted charge injection. An image sensor according to the invention can be used for, e.g., motion sensing.

28 Claims, 9 Drawing Sheets

OTHER PUBLICATIONS

O. Schrey et al., "A Locally Adaptive CMOS Image Sensor with 90dB Dynamic Range," IEEE Int'l Solid State Circuits Conference, WA–17.6 (1999).

G. Torelli et al., "Analog–to–Digital Conversion Architectures for Intelligent Optical Sensor Arrays," SPIE vol. 2950, pp. 254–264 (Aug. 1996).

David Yang et al., "A 640×512 CMOS Image Sensor with Ultra Wide Dynamic Range Floating–Point Pixel–Level ADC," Session No. 17, Nov. 1, 1998.

David Yang et al., "A 640×512 CMOS Image Sensor with Ultra Wide Dynamic Range Floating–Point Pixel–Level ADC," IEEE J. Solid State Circuits, vol. 34, No. 12, pp. 1821–1834, Dec. 1999.

David Yang et al., "A Nyquist–Rate Pixel–Level ADC for CMOS Image Sensors," IEEE J. Solid State Circuits, vol. 34, No. 3, pp. 348–356, Mar. 1999.

\* cited by examiner

PHOTO-SENSOR ARRAY FOR MOTION DETECTION

FIELD OF THE INVENTION

This invention relates to imaging systems having arrays of photo-sensors and associated storage elements, and more specifically, to an array photo-sensors having offset cancellation circuitry within each pixel.

BACKGROUND OF THE INVENTION

Photo-sensitive electronic components can be used to create electronic imaging systems, including systems for detecting and measuring motion. One application for motion detection is a computer pointing or input device, such as a computer mouse. Use of electronic imaging for such purposes is described in, e.g., U.S. Pat. Nos. 6,303,924 (titled "Image Sensing Operator Input Device") and U.S. Pat. No. 6,172,354 (titled "Operator Input Device"). As described in those patents, an array of photo-sensitive elements generates an image of a desktop (or other surface) portion when light from an associated illumination source (such as a light emitting diode) reflects from the desktop or other surface. Subsequent images are compared, and based on the correlation between images, the magnitude and direction of mouse (or other device) motion may be determined.

Figure 1:
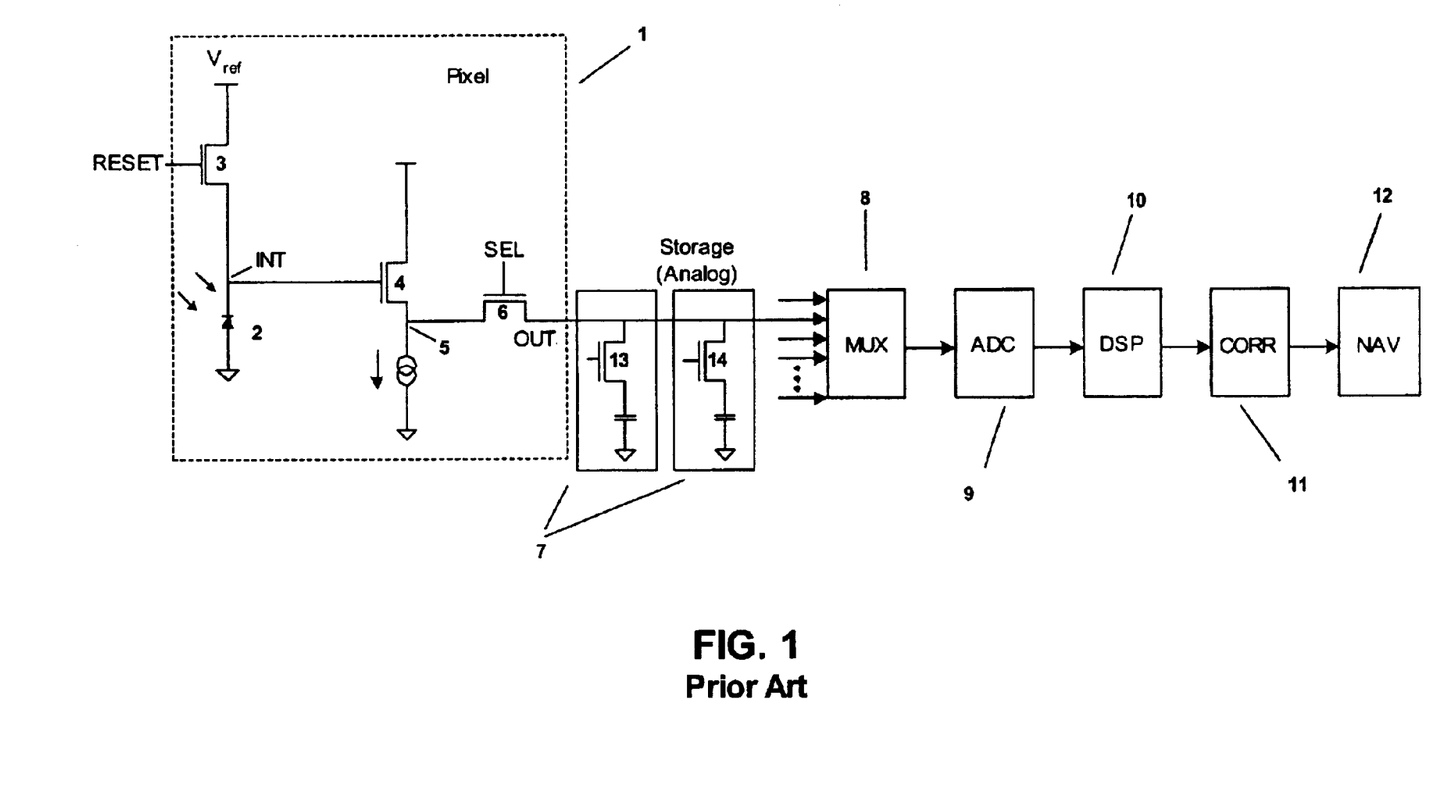
FIG. 1 is a block diagram of an existing photo-sensor architecture used for motion detection.

FIG. 1 shows a pixel 1 within a photo-sensor array architecture used in existing computer input devices. Each pixel of the photo-sensor array includes a photo-sensor 2, which may be a photodiode or other photosensitive component. Prior to obtaining an image, assertion of a RESET signal on NMOS transistor 3 charges node INT to a reference voltage $V_{REF}$. The RESET signal is then disengaged, and light reflected from a desktop or other surface illuminates photo-sensor 2. A reverse bias current flows to ground through photo-sensor 2, and node INT is then discharged as a result of the reverse bias current. Higher intensity (or brighter) light, which may correspond to a more reflective object or surface feature, allows a greater reverse bias current through photo-sensor 2, and thus a more rapid discharge of node INT. Conversely, lower intensity (or dimmer) light, which may correspond to reflection from a darker object or surface feature, allows a smaller reverse bias current through photo-sensor 2, and a less rapid discharge of node INT. The voltage on node INT controls the gate of NMOS transistor 4; as the charge on node INT is drained, the correspondingly decreasing bias on NMOS 4 causes a drop in the voltage at node 5. At a designated point in time, a SELECT signal is applied on the gate of NMOS 6, permitting a charge to accumulate on either of storage capacitors 7, depending on the state of selection NMOS devices 13 and 14. The voltage across NMOS 4 varies with the gate voltage on NMOS 4, which in turn varies with intensity of illumination upon photo-sensor 2. Thus, the magnitude of the accumulated voltage on storage capacitor 7 relates to the magnitude of the illumination upon photo-sensor 2. Because the intensity of the reflected illumination will vary based upon surface features of a desk or other surface, this charge on storage capacitor 7 can be used (as part of an array of similar photo-sensor pixels and storage elements) to detect and measure changes of position with regard to that desk or other surface.

The two NMOS selection switches 13 and 14 allow the above cycle to be performed twice. The first time the sequence is performed, NMOS switch 13 is enabled and (preferably) a known amount of light is used to illuminate the complete array. This known amount of light is typically chosen to be a dark image, i.e. no light. The second time the sequence is performed, NMOS switch 14 is enabled and NMOS switch 13 is disabled. In the second sequence, a normal light exposure is used to illuminate the photo cell. The subsequent processing of the image is performed by comparing the information stored on the capacitor connected to NMOS switch 13 to the information stored on the capacitor connected to NMOS switch 14. The process of comparing the difference of these two capacitor values is called Correlated Double Sampling (CDS), and permits cancellation of errors associated in the storing of the charge on the capacitors. Because the error was the same during both sequences, the error terms cancel. However, this scheme requires twice the number of capacitors to store the image.

The voltage on each capacitor in the array is passed through a multiplexer (MUX) 8 to an Analog to Digital Converter (ADC) 9. The ADC 9 outputs digital values corresponding to the voltages on the storage capacitors, which represent the relative intensity of illumination upon the photo-sensors in the array. These digital values may then undergo Digital Signal Processing (DSP) 10 to, e.g., enhance the image contrast and reduce the number of storage elements needed to store the resultant image. A subsequent Correlator 11 compares the DCPed image data with prior image data, and navigation data reflecting the magnitude and direction of device motion is produced at 12.

In the example of FIG. 1, 2 separate storage capacitors are required to store the value for each photo-sensor in the array. Such storage capacitors are typically located on each side of the array, and require a relatively large amount of area on an Integrated Circuit (IC). This architecture is also susceptible to parasitic signal couplings, capacitor mismatch, capacitor leakages and charge injections, and can only store an image for a relatively short time without degradation of the image data. Moreover, this architecture presents problems with regard to digitally-oriented Application Specific Integrated Circuit (ASIC) technologies, which may involve high sub-threshold leakages and low power supply voltages. The ADC function is also performed in a serial fashion, i.e., one pixel at a time. The complete frame processing must occur quickly (within times on the order of 100 μseconds) and requires a high speed ADC for high speed applications (such as detection of computer mouse movements). Although it is possible to implement multiple ADCs and other digital circuitry components to parallel process multiple pixels, the multiple components required for parallel processing must have matched properties, which further increases cost. Such parallel processing also increases overall power consumption and die size.

Alternative photosensor array configurations for electronic imaging have been suggested. However, these alternative configurations are generally not well suited for motion detection applications in compact devices (such as, e.g., computer input devices), particularly when power consumption is a concern. In the context of digital photography (and other applications in which a relatively high resolution image is sought), processing speed is often less of a concern than image quality. In a digital camera, for example, a single "snap shot" may be taken at relatively infrequent intervals (i.e., separated by several seconds or more). Conversely, a motion detector must process hundreds of images (or more) every second. Moreover, many of these alternative photo-sensor array configurations draw significant power. Although high power consumption may be acceptable when there are relatively long intervals between images, and when multiple other processing functions are not required, high power consumption can be particularly disadvantageous in motion detection devices. In addition to processing many more images per second, motion detection devices must also process the image data to determine the occurrence of (and often the magnitude and direction of) motion, and must often power an independent light source. While excessive power consumption is generally undesirable, it is especially so when a battery supplies power. Electronic photography configurations also present problems in scaling an array to a smaller size. In order to obtain a highly detailed image, numerous circuit components are necessary, and such components require space.

As indicated, many of the problems with known alternative imaging designs result, at least in part, from attempts to increase image resolution. With photo-like image quality an unnecessary or less critical design parameter, lower power and more compact designs might be possible. To date, however, no known imaging system has attempted to balance the degree of pixel-level circuit components needed for accurate motion detection images with the simplicity necessary for rapid, low power operation in a compact size.

SUMMARY OF THE INVENTION

An image sensor according to the present invention addresses many of the problems of prior art imaging systems such as shown in FIG. 1 and as described above. In the context of motion sensing, high resolution images are less critical than speed and reduction of errors caused by unpredictable variations among individual imaging elements. The present invention permits a reduction of such errors, and at the same time allows a reduction in required circuit area. The present invention further allows construction of imaging arrays that consume less power and are less expensive to fabricate.

An image sensor according to one preferred embodiment of the invention includes a pixel array located on an integrated circuit and having a plurality of pixels. Each pixel in the array has a photosensor, and the photosensor has an electrical property which varies in response to intensity of illumination. Each pixel also has a first circuit having first and second input nodes and an output node, and which is configured to generate a comparison signal at the output node in response to signals applied to the first and second input nodes. Each pixel further includes a feedback loop for selectively connecting the first input node and the output node. The image sensor also includes a plurality of multi-bit storage elements that are displaced from the portion of the integrated circuit having the pixel array. Each of the storage elements is connected to a respective pixel, such that a separate storage element is connected to each pixel. A counter signal generator provides a time-varying, multi-bit counter signal, and a reference signal generator provides a reference signal maintainable at a first value, and also varies the reference signal over time from the first value to a second value. The first input node of each pixel is connected to the photosensor in the pixel, and the second input node of each pixel receives the reference signal. Each storage element receives the counter signal, and is configured to latch a multi-bit value of the counter signal when a comparison signal generated at the storage element's respective pixel transitions from a first value to a second value.

The above and other features and advantages of the present invention will be readily apparent and fully understood from the following detailed description of preferred embodiments, taken in connection with the appended drawings.

DETAILED DESCRIPTION OF THE PREFERRED EMBODIMENTS

Figure 2:
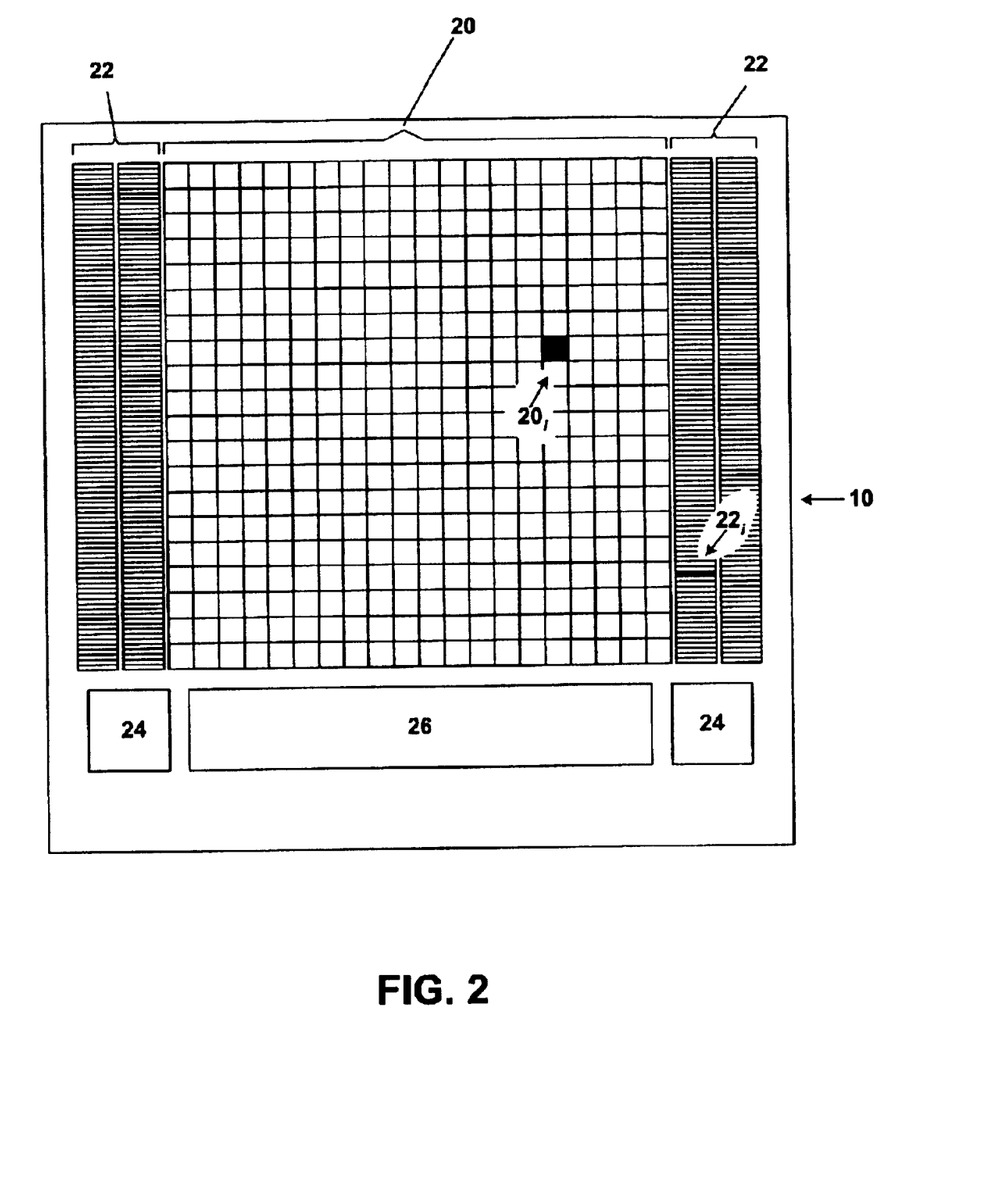
FIG. 2 is a block diagram of an Integrated Circuit (IC) containing an array of photosensor pixels and other elements according to one embodiment of the invention.

FIG. 2 is a block diagram of an Integrated Circuit (IC) 10 forming (or forming part of) an image sensor according to one embodiment of the invention. IC 10 includes an array of pixels 20. Located on either side of pixel array 20 are storage elements 22. In one preferred embodiment, a separate storage element corresponds to each pixel. In other words, there is a one-to-one correspondence between pixels and storage elements. Additional circuitry may also be located on IC 10. In the example of FIG. 2, counters, address decoders and other circuitry may be located in regions 24. Similarly, biasing circuitry and Digital to Analog Conversion (DAC) circuitry may be located in region 26. Other circuitry may also be located on IC 10, and the depicted circuitry could be rearranged and/or located on other ICs or circuit boards.

In operation, array 20 may be positioned to receive light reflected from a surface or object and thereby generate an image of the surface or object. IC 10 is in communication with, and its operation is governed by, one or more controller devices (not shown in FIG. 2, but shown in block form in FIG. 3). The controller(s) could include state machine circuitry on IC 10 or elsewhere, processor(s) located on IC 10 or elsewhere, or other suitable components capable of directing the array 20 and storage elements 22 as described herein. Except as set forth below, the details of such controller device components are not necessary for an understanding of the invention. Hardware, software and/or firmware suitable for implementation of a photo-sensor array of the invention will be apparent to one of ordinary skill in the art from the information provided herein.

Figure 3:
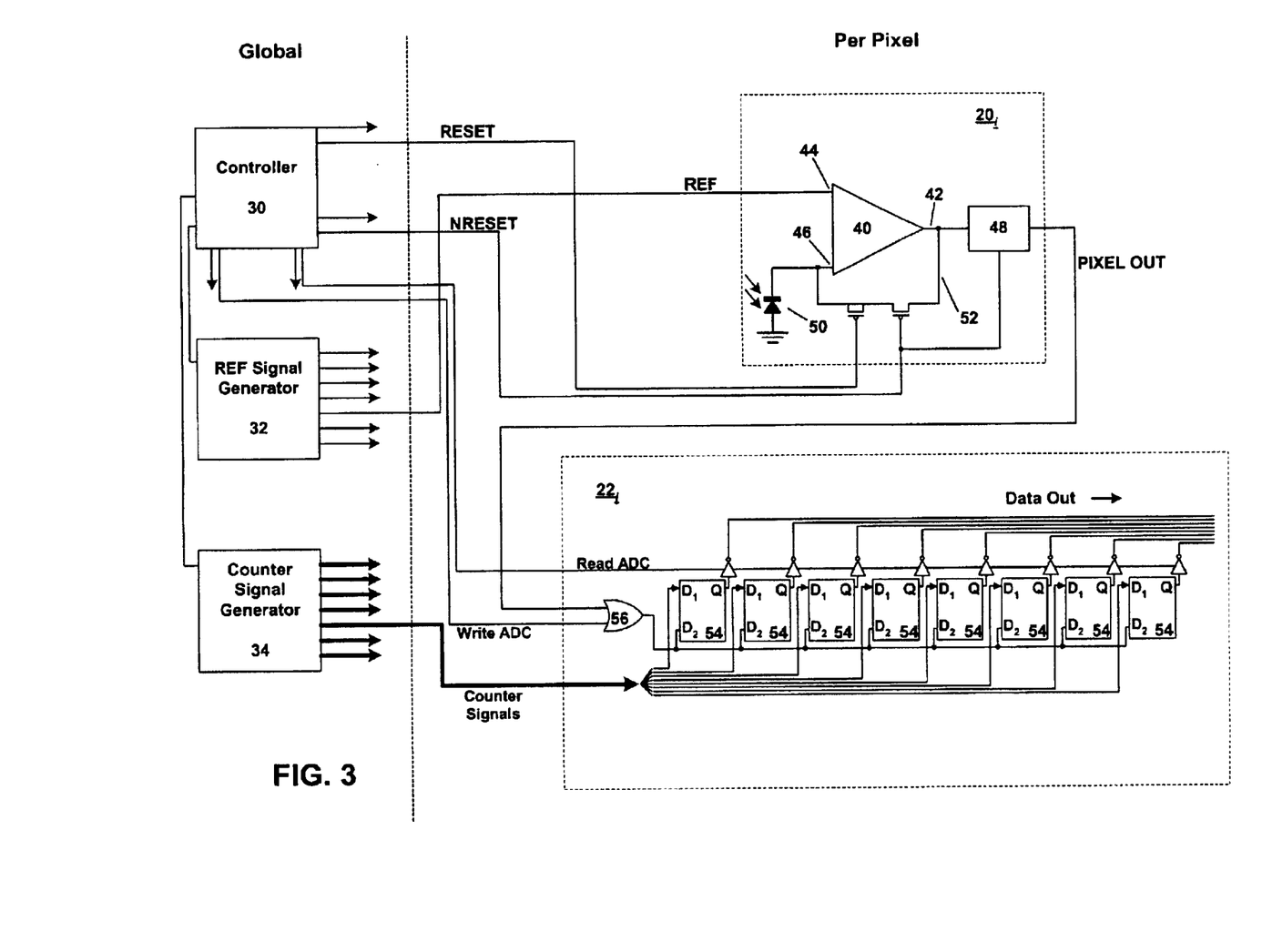
FIG. 3 is a block diagram showing a pixel and a corresponding storage element from the IC of FIG. 2.

A representative pixel $20_i$ and its corresponding storage element $22_i$ are darkened in FIG. 2. FIG. 3 shows a more detailed block diagram for pixel $20_i$ and storage element $22_i$, as well as blocks representing a controller 30, reference signal generator 32 and counter signal generator 34. Reference signal generator 32 includes circuitry that, under direction from controller 30, generates a signal (REF) having a high level and a low level, and which can be varied from one level to the other over a designated period of time. In a preferred embodiment, reference signal generator 32 is a Digital to Analog converter which, in response to a digital signal, generates a signal that linearly decreases from the high level to the low level; reference signal generator 32 is also able to maintain the REF signal at the high or low level for a desired time interval. The details and implementation circuitry required for a signal generator such as reference signal generator 32 are known in the art, and thus not further described herein. Counter signal generator 34 includes circuitry that, in response to a clocking signal or other time-dependent signal, generates a multi-bit signal that can be used to measure elapsed time. In a preferred embodiment, counter signal generator 34 is a counter that generates a 10-bit gray code, and which may be synchronized with transition of the REF signal from high to low. As with the reference signal generator 32, the details and implementation circuitry required for such a gray code counter are known in the art and thus not further described herein.

Controller 30, reference signal generator 32 and counter signal generator 34 are placed to the left of the large dashed line (under "Global") in FIG. 3 to indicate that these components serve multiple pixels within the array 20 and multiple storage elements 22. Placed to the right of the dashed line in FIG. 3 (under "Per Pixel") are a block diagram of a representative pixel $20_i$ and of a storage element $22_i$ that is associated with pixel $20_i$. Pixel 201 and storage element $22_i$ are representative of other pixels and storage elements on IC 10. Pixel $20_i$ and storage element $22_i$ receive various signals from controller 30, reference signal generator 32 and counter signal generator 34. Controller 30, reference signal generator 32 and counter signal generator 34 may also be located on IC 10. As shown by the multiple arrows emanating from controller 30, reference signal generator 32 and counter signal generator 34, the REF signal, the counter signal and various signals provided by controller 30 (RESET, NRESET, Write ADC and Read ADC) are provided to other pixels and storage elements in addition to pixel $20_i$ and storage element $22_i$. As explained in more detail below, however, at least one signal (PIXEL OUT) is transmitted from each pixel (such as pixel $20_i$) to its corresponding storage element (such as storage element $22_i$), but not to other storage elements.

Pixel $20_i$ includes a circuit 40 forming a differential pair gain stage. Circuit 40 has an output node 42 and two input nodes 44 and 46. Output node 42 is connected to inverter block 48. Input node 46 is connected to ground through a photo-sensor 50. Photo-sensor 50 may be a photodiode. In alternate embodiments, photo-sensor 50 could be a phototransistor or other illumination-sensitive component. The other input node 44 receives the REF signal from reference signal generator 32. Input node 46 and output node 42 are also connected by a feedback loop 52 having two switch transistors. One switch transistor receives the RESET signal; the other switch transistor and the inverter block 48 receive the NRESET signal. Circuit 40 functions as a comparator when feedback loop 52 is open, and as a simple single-stage buffering operational amplifier (op amp) when feedback loop 52 is closed.

Storage element $22_i$ includes multiple one-bit latches 54. Although eight latches 54 are shown, additional latches 54 could be included to, e.g., store values of a counter signal having additional bits. The $D_1$ input of each latch 54 is one of multiple parallel bit lines providing the counter signal. Each latch 54 also includes a $D_2$ input. When the signal received by the $D_2$ input is high, each latch 54 outputs at Q the value being received at $D_1$. When the $D_2$ input goes low, the output Q of each latch 54 remains at the value of $D_1$ at the point in time when $D_2$ went low, thereby latching the $D_1$ value when $D_2$ goes low. Parallel data lines emanate from the outputs Q of the latches 54. At an appropriate time, the latched values are read in parallel through the data lines so as to provide a multi-bit digital signal corresponding to the point in time at which the $D_2$ signal went low. As also shown in FIG. 3, a one-bit PIXEL OUT signal is transmitted from the inverter block 48 of pixel $20_i$ to OR gate 56 of storage element $22_i$, and the output of OR gate 56 provides the $D_2$ input for each latch 54 in storage element $22_i$. The output of OR gate 56 is high whenever either the PIXEL OUT signal (from inverter block 48 of pixel $20_i$) or the Write ADC signal (from controller 30) is high. The Write ADC signal could be used, in conjunction with appropriate counter signal values, to clear the latches 54. A Read ADC signal may be transmitted by the controller 30 to read the latched values from latches 54 into another memory location for subsequent DSP, correlation and other purposes. Pixel 20 and storage element $22_i$ are generally representative of other pixel/storage element pairs on IC 10.

Figure 4:
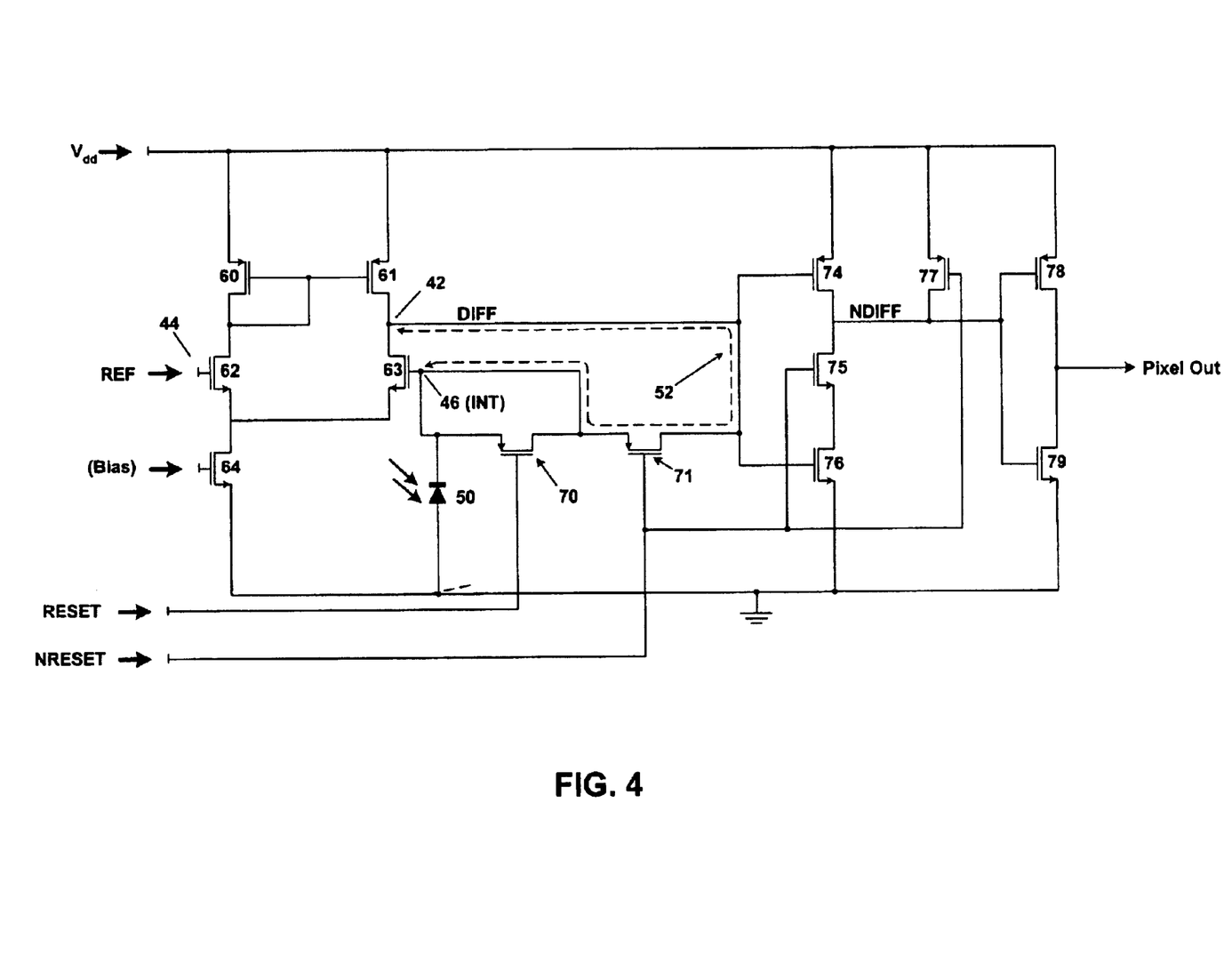
FIG. 4 is a schematic diagram of a pixel according to one embodiment of the invention.

FIG. 4 is a schematic diagram for pixel $20_i$, and is also representative of other pixels in array 20. Transistors 60, 61, 62, 63 and 64 form the circuit 40 shown in FIG. 3.

PMOS devices 60 and 61 are connected to source voltage $V_{dd}$ and form a current mirror. One current path includes NMOS device 62, the gate of which forms input node 44 of circuit 40, and which receives the REF signal. The other current path includes NMOS device 63, the gate of which forms input node 46, the voltage at which is labeled INT. Photodiode 50 connects the gate of NMOS device 63 to ground; when exposed to illumination, a reverse bias current through photodiode 50 discharges the voltage at node 46.

Output node 42 is located between PMOS device 61 and NMOS device 63, and provides an output voltage DIFF. When the feedback loop 52 is open and the voltage of the REF signal is higher than the INT voltage, less current is able to flow through device 61 to ground. In this state, the DIFF voltage at the output node 42 is close to $V_{dd}$ (approximating a high logic level signal). When the voltage of the REF signal is lower than the INT voltage, more current is able to flow from device 61 to ground through device 63, and the DIFF voltage at the output node 42 is close to ground (approximating a low logic level signal). As also shown in FIG. 4, the output node 42 is connected to node 46 by feedback loop 52, the operation of which is described in more detail below. Included in feedback loop 52 are PMOS devices 70 and 71, the operation of which is also described below. The source and drain of device 70 are shorted.

Inverter block 48 (FIG. 3) is formed by PMOS devices 74, 77 and 78 and by NMOS devices 75, 76 and 79. The DIFF voltage from output node 42 biases the gates of PMOS device 74 and NMOS device 76. The voltage output of the first inverter stage (NDIFF) biases the gates of PMOS device 78 and NMOS device 79, which form the second inverter stage. The high or low state of the second inverter stage output (PIXEL OUT) thus corresponds (when the NRESET signal is high, as described below) to the high or low state of the DIFF voltage. Inverter box 48 also contains a NMOS device 75 and a PMOS device 77, the gates of which are biased by the NRESET signal, and the operation of which is further described below.

Under ideal conditions, devices 60 and 61 would be perfectly matched in electrical properties, as would devices 62 and 63. Under such conditions, the comparator output at node 42 (DIFF) would go high at the exact point where the voltage at node 44 (REF) begins to exceed the INT voltage at node 46. The node 44 of each pixel could then be charged to the same REF voltage, and the node 46 of each pixel charged to the same INT voltage (with INT being different that REF). Each pixel could then be illuminated, and the time for the DIFF voltage to go low measured for each pixel. The measured time could then be translated into an illumination intensity for each pixel. Unfortunately, such perfect matching is not always possible or practical. Matching of component electrical properties becomes more difficult (and expensive) as size is decreased. Moreover, component mismatching can cause voltage offsets in pixels such that the output signal (DIFF) goes low when the REF signal becomes less than the INT voltage plus (or minus) an unknown offset value. The offset may not be (and generally will not be) the same among different pixels.

Figure 5:
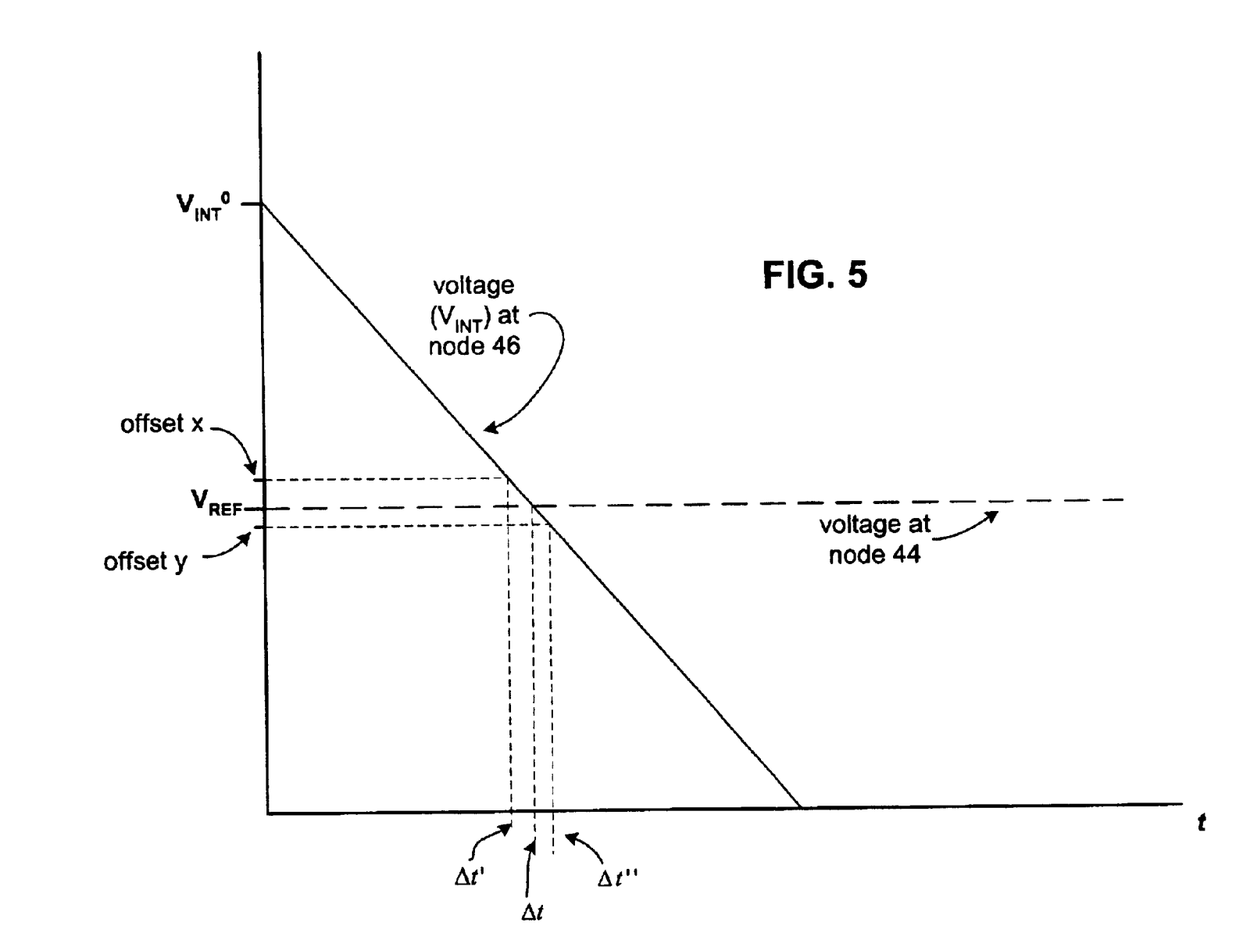
FIG. 5 is a graph illustrating an effect of voltage offsets.

FIG. 5 further shows the problem posed by offsets caused by device mismatch, also known as first order offset. In the example of FIG. 5, illumination is being measured by setting node 46 to an initial value ($V_{INT}^0$) and setting node 44 to $V_{REF}$, with $V_{REF} < V_{INT}^0$. When a light source is enabled, $V_{INT}$ drops, and eventually crosses $V_{REF}$. The speed with which $V_{INT}$ drops (i.e., the steepness of the $V_{INT}$ line in FIG. 5) increases with increased illumination, and the time for $V_{INT}$ to drop is measured and used as a measure of illumination intensity. If the devices within a comparator are matched, the output voltage (DIFF, not shown in FIG. 5) at node 42 will go high as the node 46 voltage crosses $V_{REF}$, i.e., at time $\Delta t$. If a comparator's devices are not matched, however, the output voltage DIFF at node 42 will not go high at time $\Delta t$. Instead, the DIFF voltage will go high when the node 46 voltage passes a point that is above $V_{REF}$ (offset x) or below $V_{REF}$ (offset y). Each of these offsets would result in the voltage at output node 42 going high at different times ($\Delta t'$, $\Delta t''$). If two pixels received the same illumination, but one pixel had offset x and the other had offset y, two different illumination levels would be incorrectly indicated, leading, e.g., to fixed pattern noise in the generated image data.

The present invention avoids these potential errors by substantially canceling first order offsets. Instead of elevating $V_{INT}$ above $V_{REF}$ and then measuring the time for $V_{INT}$ to become less than $V_{REF}$ (plus or minus an offset), $V_{INT}$ and $V_{REF}$ are initially set to the same level, plus or minus an offset. $V_{INT}$ is then dropped by illumination of photodiode 50 and held at the dropped level. $V_{REF}$ is then dropped, and the time for $V_{INT}$ (at the dropped level) to once again exceed $V_{REF}$ (plus or minus the same offset) measured. As explained below, this provides Correlated Doubling Sampling (CDS) and thereby reduces errors caused by first order offsets.

Referring to FIG. 4, node 46 is initially charged by feedback loop 52. If there were no voltage offsets, closure of feedback loop 52 would cause nodes 44 and 46 to be at the same voltage. In order for the same current to flow through both sides of the current mirror formed by devices 60 and 61, the same current must flow through devices 62 and 63, and node 46 must be at the same voltage as node 44. If the comparator devices are not matched, however, there may be voltage offsets. For example, in order to allow the same current flow through both sides of the current mirror, NMOS 63 might require a voltage at node 46 that is slightly above (or below) the voltage at node 44 by an offset amount. Closure of feedback loop 52 would thus charge node 46 to the voltage of node 44 plus (or minus) that offset. The offset would similarly have effect if the voltage at node 44 or 46 is varied. If, for example, the feedback loop 52 is opened, and the INT voltage at node 46 dropped (by, e.g., illuminating diode 50), the output voltage (DIFF) will go high when the INT voltage at node 46 is no longer greater than or equal to the REF signal voltage at node 44 plus (or minus) the offset.

Figure 6:
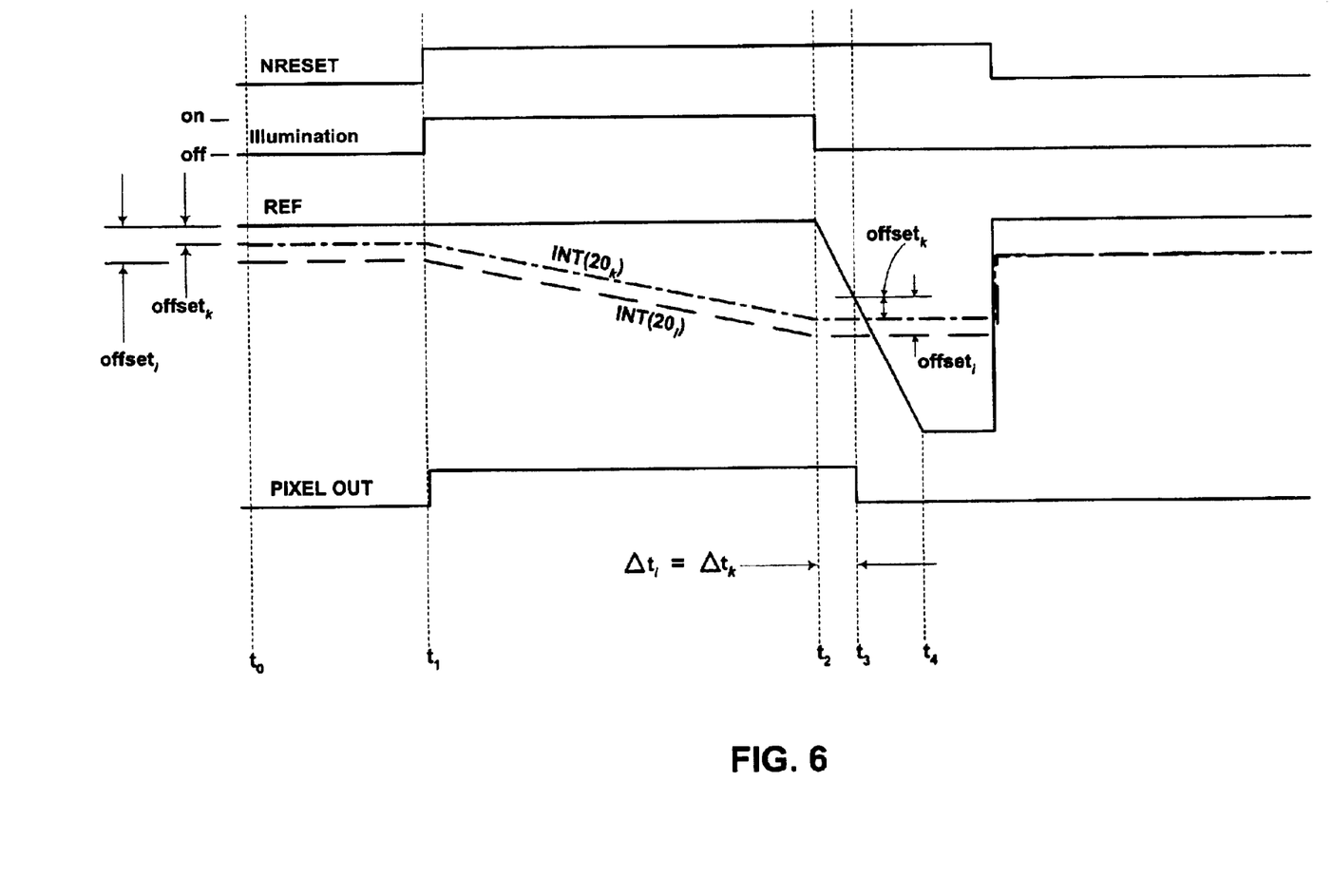
FIG. 6 is a timing diagram for operation of pixels according to one embodiment of the invention.

As shown in FIG. 6, the offset may be cancelled by varying the voltages at both input nodes. FIG. 6 is a timing diagram explaining operation of pixel $20_i$ and of another pixel $20_k$ (not shown in FIGS. 2–4) during one imaging cycle. For purposes of illustration, pixels $20_i$ and $20_k$ are exposed to the same illumination level. Although FIG. 6 shows offset$_i$ and offset$_k$ as having the same polarity, either or both could be of opposite polarity. The NRESET line represents the state of the NRESET signal (i.e., low or high), and corresponds to closure of feedback loops 52 for pixels $20_i$ and $20_k$. In other words, when NRESET is low, the nodes 42 and 46 of pixel 20, and of pixel $20_k$ are connected. Node 46 of pixel $20_i$ is thereby charged to $V_{REF}$ minus offset$_i$; node 46 of pixel $20_k$ is charged to $V_{REF}$ minus offset$_k$. The Illumination line represents the condition of an illumination source such as a Light Emitting Diode (LED). The REF line indicates the voltage level of the REF signal. The lines labeled INT($20_i$) and INT($20_k$) represent the INT voltages of the nodes 46 of pixels $20_i$ and $20_k$, respectively. The PIXEL OUT line indicates the state of the PIXEL OUT voltage signal for pixels $20_i$ and $20_k$.

At time $t_0$, the NRESET signal is low. The illumination source is not activated, as indicated by the low value of the Illumination line. Because NRESET is low, nodes 42 and 46 of the circuits 40 are connected in pixels $20_i$ and $20_k$, and the INT voltage at each pixel is equal to the REF signal voltage minus respective offset offset$_i$ or offset$_k$.

At time $t_1$, the NRESET signal goes high (breaking the connection between node 42 and node 46 within each pixel), and the illumination source is turned on (illumination high in FIG. 6). Light falling on photodiode 50 within each pixel allows a reverse bias current through each photodiode 50, thus discharging each node 46 toward ground. Because pixels $20_i$ and $20_k$ are illuminated with equal intensity in the example, the voltages at their nodes 46 drop at the same rate. Accordingly, the INT ($20_i$) and INT ($20_k$) lines have the same slope.

The REF signal is held high while the illumination source is activated (the $t_1$–$t_2$ interval), and the DIFF voltage (and thus the PIXEL OUT signal) at each pixel's output node 42 goes high when the INT voltage for the pixel drops. At time $t_2$, the illumination is turned off, and the REF signal to all pixels is decreased from its high value to its low value, as shown by the downwardly sloping REF signal voltage line from $t_2$ to $t_4$ in FIG. 6. Preferably, the decrease is linear, as shown in FIG. 6. Because the illumination source is turned off, the current through the photodiode 50 in each pixel substantially stops, and the INT voltage within each pixel holds at the level reached when the illumination source is deactivated. When the falling REF signal voltage reaches the level of a pixel's INT voltage plus (or minus) any applicable offset voltage for the pixel, the DIFF voltage at the pixel's output node 42 goes low. As shown in FIG. 6, the PIXEL OUT signal goes low for pixel $20_i$ at time t3, when $Vh_{REF}$ reaches the value of INT($20_i$) at time $t_2$ plus the offset$_i$ voltage. Similarly, the PIXEL OUT signal also goes low for pixel $20_k$ at time $t_3$, when $V_{REF}$ reaches the value of INT($20_k$) at time $t_2$ plus the offset$_k$ voltage. In this manner, two pixels with different offsets can provide the same output in response to the same illumination.

Figure 7:
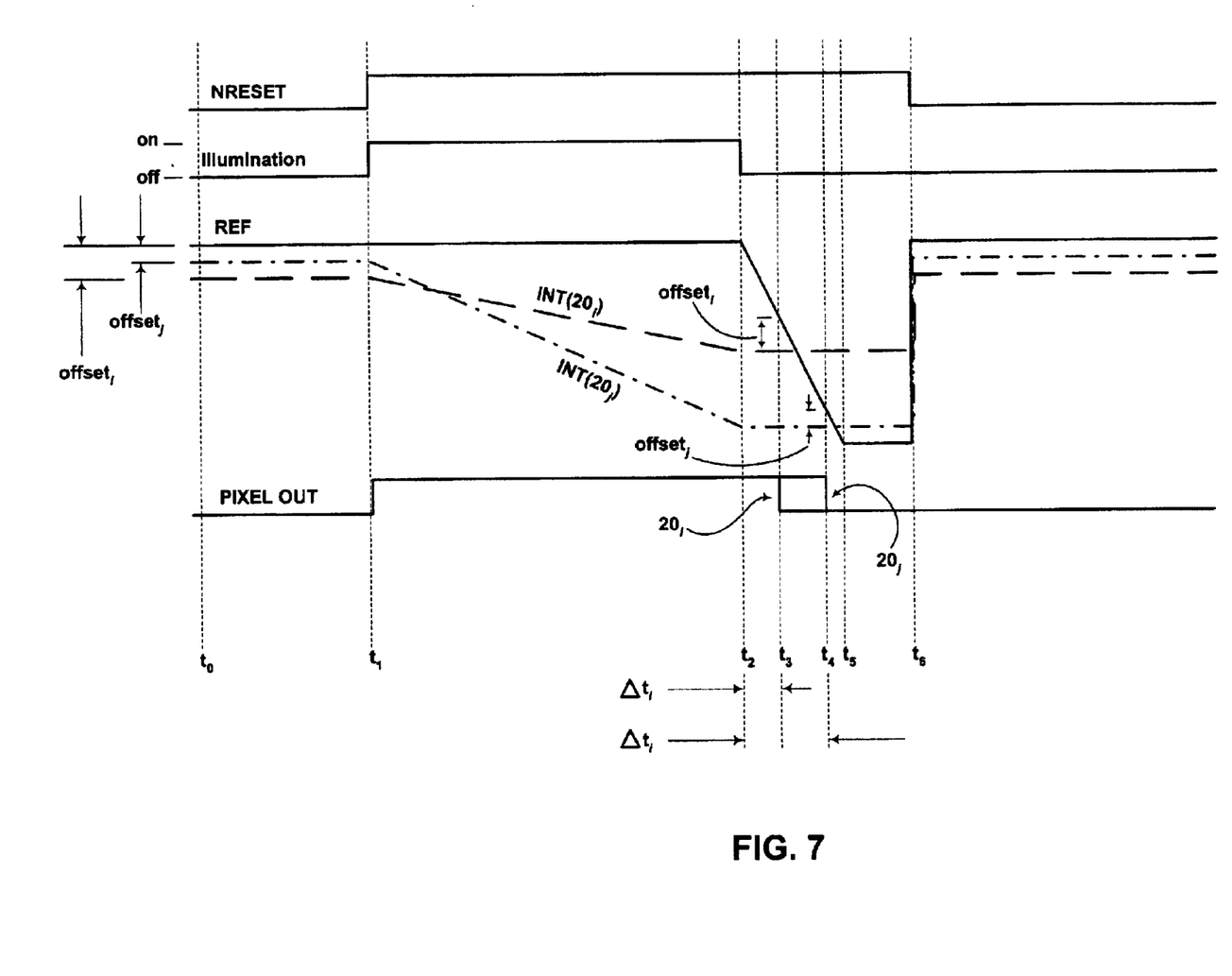
FIG. 7 is another timing diagram for operation of pixels according to one embodiment of the invention.

FIG. 7 is a more generalized timing diagram explaining operation of pixel $20_i$ and of another pixel $20_j$ (not shown in FIGS. 2–4) during one imaging cycle. In the example of FIG. 7, pixels $20_i$ and $20_j$ are not illuminated at the same intensity. As before, the NRESET line represents the state of the NRESET signal (i.e., low or high); the Illumination line represents the condition of an illumination source such as a Light Emitting Diode (LED); and the REF line indicates the voltage level of the REF signal. The lines labeled INT($20_i$)

and INT($20_j$) represent the INT voltage states of the nodes 46 of pixels $20_i$ and $20_j$, respectively. The PIXEL OUT line indicates the state of the PIXEL OUT voltage signal for pixels $20_i$ and $20_j$; except for small portions labeled otherwise, the PIXEL OUT lines for pixels $20_i$ and $20_j$ are coincident.

At time $t_0$, the NRESET signal is low. The illumination source is not activated, as indicated by the low value of the Illumination line. Because NRESET is low, nodes 42 and 46 are connected in pixels $20_i$ and $20_j$ as well as in other pixels in array 20. In this mode, each pixel's feedback loop 50 is closed, and the INT voltage at node 46 of each pixel is equal to the REF signal voltage, plus (or minus) any pixel-specific offset caused by any device mismatching within each pixel's comparator/op-amp circuit. As shown in FIG. 7, an offset$_i$ is present between the INT voltage and REF signal voltages for pixel $20_i$. Similarly, an offset$_j$ exists between the INT voltage and REF signal voltages for pixel $20_j$.

When NRESET is low, PMOS 77 is conducting and NMOS 75 is non-conducting.

Accordingly, the voltage NDIFF is high without regard to the output node voltage DIFF. The high NDIFF signal voltage makes NMOS transistor 79 conducting and PMOS transistor 78 non-conducting, thereby causing the pixel's output signal (PIXEL OUT) to be low.

At time $t_1$, the NRESET signal goes high and the RESET signal (not shown in FIG. 7) goes low. Because RESET is low, PMOS transistor 70 becomes conducting, and PMOS transistor 71 is non-conducting, breaking the connection between node 46 and node 42 within each pixel. At the same time, the illumination source is turned on (illumination high in FIG. 7). Light falling on photodiode 50 within each pixel allows a reverse bias current through each photodiode 50, thus discharging each node 46 toward ground. The magnitude of the reverse bias current (and thus the speed at which the INT voltage at a node 46 is discharged) varies with the intensity of illumination. As shown in FIG. 7, the voltage line INT($20_j$) drops more steeply than the voltage line INT($20_i$) during the time that the illumination is activated.

Accordingly, the photodiode 50 of pixel $20_j$ is more brightly illuminated than the photodiode 50 of pixel $20_i$, causing a more rapid discharge of node 46 within pixel $20_j$ than of node 46 within pixel $20_i$. This may correspond to pixel $20_j$ receiving light from a more reflective surface feature and pixel $20_i$ receiving light from a less reflective surface feature.

Still referring to FIG. 7, the REF signal is held high while the illumination source is activated (the $t_1$–$t_2$ interval), and the DIFF voltage at each pixel's output node 42 goes high when the INT voltage for the pixel drops. Because NRESET is high, NMOS 75 is on and PMOS 77 is off, and the PIXEL OUT voltage also goes high when the INT voltage drops. The illumination ($t_1$–$t_2$) interval is the same for all pixels in the array 20, and can be arbitrarily chosen. However, the $t_1$–$t_2$ interval is preferably of sufficient duration to allow all pixels' photodiodes to at least partially discharge over a desired range of illumination intensity, but not so long that pixels may discharge to below the lowest range of the REF signal before the illumination is discontinued. The interval is preferably the same from imaging cycle to imaging cycle, but can be varied.

Beginning at time $t_2$, the REF signal to all pixels is decreased from its high value to its low value, as shown by the downwardly sloping REF signal voltage line from $t_2$ to $t_5$ in FIG. 7. Preferably, the decrease is linear, as shown in FIG. 7. Because the illumination source is turned off, the current through the photodiode 50 in each pixel substantially stops, and the INT voltage within each pixel holds at the level reached when the illumination source is deactivated. When the falling REF signal voltage reaches the level of a pixel's INT voltage plus or minus any offset voltage for the pixel, the DIFF voltage at the pixel's output node 42 goes low. As shown in FIG. 7, the INT voltage fell less in pixel $20_i$ than in pixel $20_j$. Accordingly, the dropping REF signal voltage first reaches the (INT($20_i$)+offset$_i$) value at time $t_3$, causing the PIXEL OUT signal for pixel $20_i$ to also go low at time $t_3$. Subsequently, the dropping REF signal voltage reaches the (INT($20_j$)+offset$_j$) value at time $t_4$, causing the PIXEL OUT signal for pixel $20_j$ to then go low at time $t_4$. The INT voltage for other pixels in the array will similarly vary based on how fast each respective node 46 discharged while the illumination source was activated. As also shown in FIG. 7, the same voltage offset, present between REF and INT($20_i$) when the INT voltage began to drop ($t_1$) is present when the falling REF voltage causes PIXEL OUT for pixel $20_i$ to go low at time $t_3$. Errors attributable to the offset$_i$, are thereby cancelled out for pixel $20_i$. Similarly, the voltage offset$_j$ present between REF and INT($20_j$) when the INT voltage began to drop ($t_1$) is present when the falling REF voltage causes PIXEL OUT for pixel $20_j$ to go low at time $t_4$. Errors attributable to the offset, are thereby cancelled out for pixel $20_j$. In this fashion, varying (and unpredictable) first order offsets within individual pixels of the array are canceled, and image distortion is reduced.

Second order offsets will also be present, and are caused by CDS using a high REF value for one sample and a low ref value for the other sample. In other words, node 46 is initially charged when the REF signal is high, but the comparison of when the INT and REF signals cross occurs when the REF signal is at some lower voltage. Although this creates a small amount of signal gain that effectively changes the input offset by a small amount between $t_1$ and $t_2$, the additional offset error does not significantly affect imaging accuracy.

When the output node voltage DIFF goes low at time $t_3$ for pixel $20_i$, the NDIFF signal is high, and the PIXEL OUT signal is low. As shown in FIG. 3, the PIXEL OUT signal for pixel $20_i$ is received by OR gate 56 of storage element $22_i$. So long as the output of OR gate 56 is high, each latch 54 outputs (at Q) the bit value received at $D_1$. When the OR gate 56 output goes low, each latch 54 outputs the bit value received at $D_1$ when the $D_2$ signal went low. Because the $D_2$ inputs for each storage element 22 go low when the PIXEL OUT signal for the corresponding pixel goes low (assuming the Write ADC signal is not high), the latches 54 of each storage element 22 will latch a series of bits forming a gray code value corresponding to the time required for the REF signal voltage to drop to the INT voltage (+/− offset) for that pixel. Because the illumination interval and the REF signal are the same for all pixels, and because each latched gray code represents the time required for a given pixel's output to change based on those common stimuli, the latched gray code represents the relative intensity of illumination for a pixel. As seen in FIG. 7, the PIXEL OUT signal for pixel $20_i$ goes low at time $t_3$, and the storage element 22, latches a gray code value corresponding to a time interval of duration $\Delta t_i$. The PIXEL OUT signal for pixel $20_j$ goes low at time $t_4$, and the storage element $22_j$ corresponding to pixel $20_j$ (not shown in the FIGS.) latches a gray code value corresponding to a time interval of duration $\Delta t_j$. The time interval $\Delta t_j$ is longer than $\Delta t_i$, indicating pixel $20_j$ was more intensely illuminated than pixel $20_i$.

These latched values within each storage element 22 may then be read and stored in other memory locations for comparison with multi-bit values from a prior (or subsequent) imaging cycle. The REF signal continues ramping downward until time $t_5$. The total time for the REF signal to go from the high value ($t_2$) to the low value ($t_5$) is chosen such that there is a sufficiently wide range of counter signal values between the darkly lit pixels (which may have little or no drop in INT voltage) and brightly lit pixels (which may have a large drop in INT voltage). At time $t_6$, NRESET again goes low, and each pixel's node 42 and node 46 are connected. The REF signal is brought high, node 46 of each pixel is charged to the REF signal voltage (except for individual offsets), and the pixel array is ready for another imaging cycle. Although not shown in FIG. 7, the storage elements 22 may be cleared before the illumination source is again activated, and the counter signal reset to an initial value.

In one preferred embodiment of the invention, image quality is further enhanced by charge-reduction components in the feedback loop. Specifically, feedback loop 52 includes PMOS devices 70 and 71. As is known, opening an FET switch induces a charge into a circuit because of gate to channel capacitance of the device and channel charge. Closing the switch also induces a charge, but of opposite polarity. The amount of this charge can be unpredictable. If only a single device were used to open and close feedback loop 52, this charge could increase or decrease the INT voltage of node 46 of each pixel, but in a non-uniform and unpredictable manner. This additional non-uniform and unpredictable variation on the INT voltage for each device would degrade image (and thus, motion detection) accuracy. Including two matched devices in feedback loop 52 permits reduction of some or all of this additional charge. In operation, devices 70 and 71 toggle simultaneously (i.e., one switches on while the other switches off). In other words, as device 71 toggles off (NRESET goes high) and impresses a charge of one polarity onto node 46, device 70 toggles on (RESET goes low) and impresses a similar charge of opposite polarity. In this manner, unpredictable charge injections are minimized and image accuracy enhanced. Typically, it is assumed that half of the channel charge in an FET device goes to the node connected to the FET source, and the other half goes to the node connected to the FET drain. In the case of circuit 40, however, node 42 is a low impedance, non-accumulating node. Accordingly, the charge injected into node 42 can be ignored. The charge injected by device 71 is therefore cancelled by making the physical size of device 70 approximately half (or slightly larger than half) the size of device 71 to account for the difference between nodes 42 and 46.

As indicated above, the inverter block 48 (FIG. 3) of each pixel may include, in one preferred embodiment, a first (tri-state) inverter formed by PMOS device 74 and NMOS devices 75 and 76. The inverter block further includes a second inverter formed by PMOS device 78 and NMOS device 79. The DIFF voltage from output node 42 biases the gates of PMOS device 74 and NMOS device 76 in the first inverter stage, which provides an output NDIFF. The NDIFF voltage biases the gates of PMOS device 78 and NMOS device 79 in the second inverter stage, which provides the PIXEL OUT signal. The high or low state of the second inverter stage output (PIXEL OUT) thus corresponds to the high or low state of the DIFF voltage. However, the high and low states of the DIFF voltage may not correspond to high and low voltage levels that are usable (or that are preferred for use) as digital logic levels. Accordingly, the inverter block 48 provides the necessary voltage gain. By using a tri-state inverter as the first inverter stage, power consumption is reduced when the feedback loop is closed (i.e., when the comparator becomes a unity gain op amp). When the feedback loop is closed, the voltage level at nodes 42 and 46 may be at a level that allows some current to flow through devices 74 and 76. By using a tri-state inverter as the first stage, however, current flow to ground (and thus, power loss) during feedback can be reduced. When the NRESET signal is low, no current flows through device 75. Device 77 is on when the NRESET signal is low, thereby holding the PIXEL OUT signal at a logical low voltage.

Figure 8:
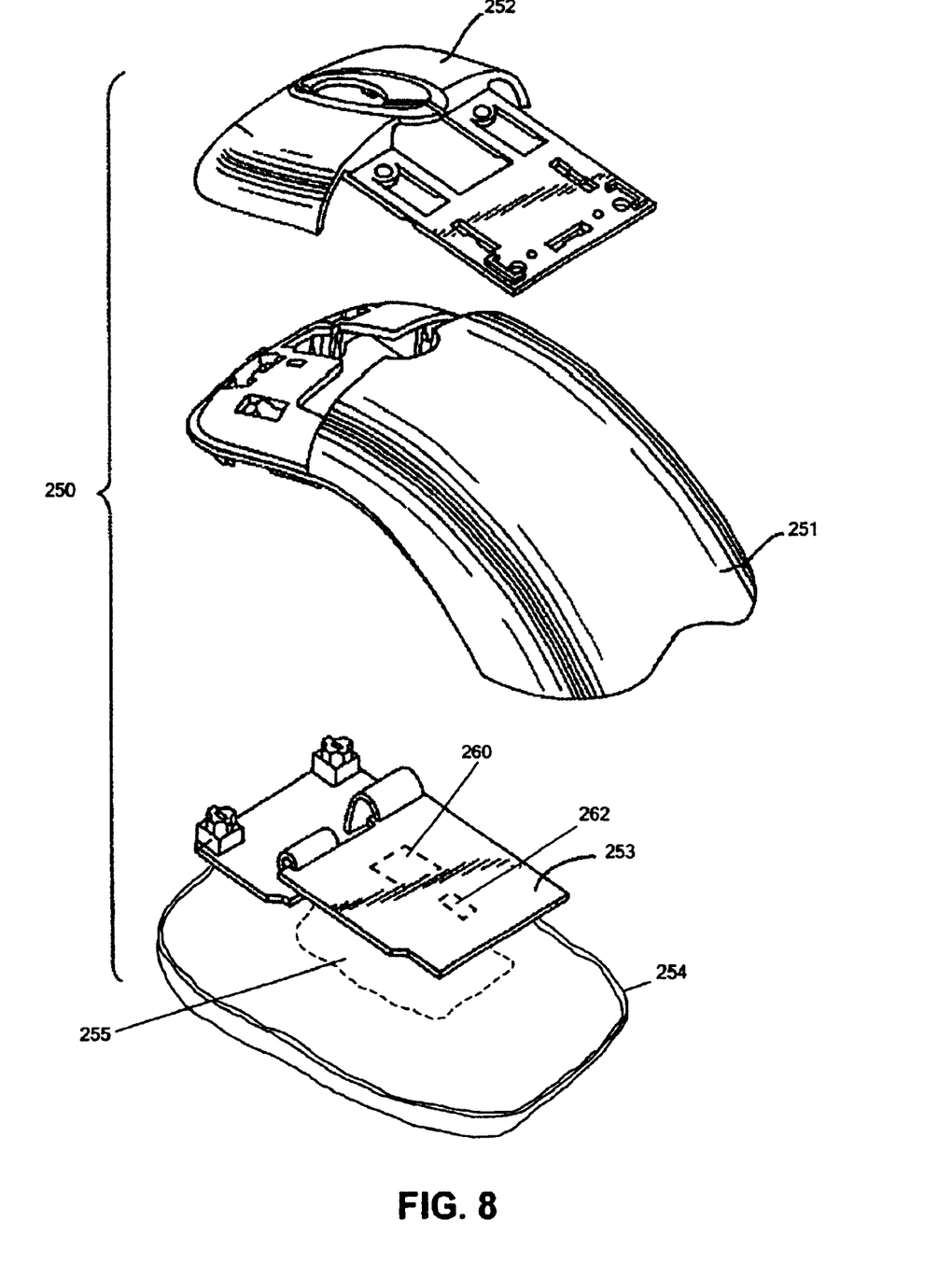
FIGS. 8 and 9 show one implementation of a pixel array according to the invention in a computer mouse.
Figure 9:
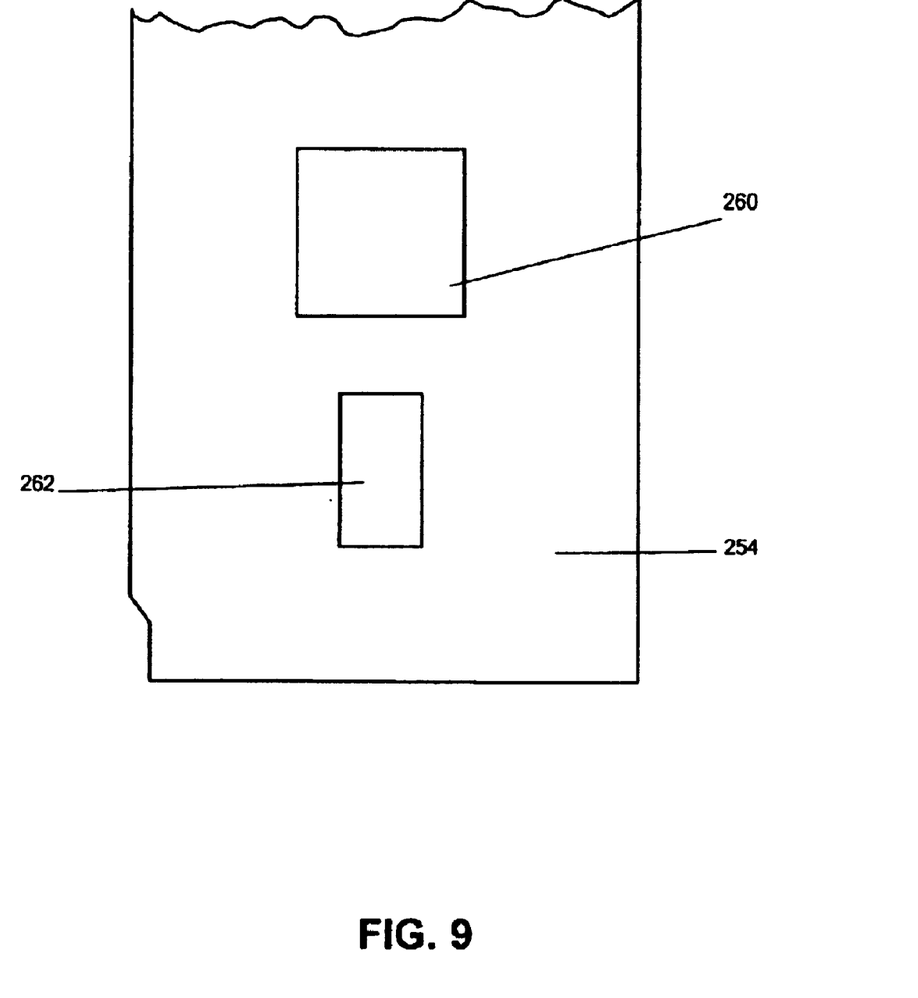

An image sensor according to the invention can be used for motion detection, and more specifically, as part of a computer input or pointing device. Such devices include computer mice, trackballs and other devices which track movement. FIG. 8 shows an example of one possible implementation in a computer mouse of an image sensor according to the invention. Illustrated in FIG. 8, in an exploded perspective view, are several major components of a typical mouse 250. Mouse 250 includes an upper case 251, a set of keys 252, a circuit board 253, and a lower case 254. Other components of mouse 250 are not shown, but could include a power source (for battery powered mice), a cable for communication with a computer (if not a wireless device), a scroll wheel and other mechanical components; and various circuit components. These other components are known in the art and their illustration is not required for an understanding of the invention. As is known in the art, a user operates mouse 250 by moving mouse 250 over a desktop or other surface. The underside of lower case 254 is in contact with the desktop or other surface, and is either transparent or includes a transparent portion 255. A lens or other focusing element (not shown) could also be located between the transparent portion 255 and circuit board 253, or incorporated into transparent portion 255. Located on the underside of circuit board 253 are an imaging chip 260 (shown in outline in FIG. 8) and a LED 262 (also shown in outline in FIG. 8). In an exemplary embodiment of the invention, imaging chip 260 could correspond to IC 10 (FIG. 2). In operation, light from LED 262 reflects from a desk top or other surface, shines through transparent region 255 (and a focusing element, if present), and is received by a pixel array located on chip 260. FIG. 9 is a partial view of the underside of circuit board 253 showing imaging chip 260 and LED 262. Image data obtained from imaging chip 260 during multiple imaging cycles can be compared, and the direction and magnitude of motion of mouse 250 with respect to a desktop (or other surface) calculated.

Although specific examples of carrying out the invention have been described, those skilled in the art will appreciate that there are numerous variations and permutations of the above described systems and techniques that fall within the spirit and scope of the invention as set forth in the appended claims. As but one example, pixels of an array according to the invention could include photo-sensors that respond to illumination outside of visible light wavelengths. As another example, a pixel array according to the invention might also be implemented in various other applications. Examples include motion detection for alarm purposes, incorporation of the pixel array into an electronic ruler or yardstick used to measure distance, and use of the pixel array as part of a paper motion sensor in a printer. These and other modifications are within the scope of the invention as defined by the attached claims.

What is claimed is:

1. An image sensor, comprising:
   a pixel array located on a first portion of an integrated circuit and having a plurality of pixels, each pixel having:

a photosensor having an electrical property which varies in response to intensity of illumination, a first circuit switchable between operation as a comparator and as an op amp, the first circuit having first and second input nodes and an output node, and being configurable to generate a comparison signal at the output node in response to signals applied to the first and second input nodes, and a feedback loop for selectively connecting the first input node and the output node so as to switch the first circuit between operation as an op amp and as a comparator;

a plurality of multi-bit storage elements displaced from the first portion of the integrated circuit, each of the storage elements connected to a respective one of the plurality of pixels, such that a separate storage element in the plurality is connected to each pixel;

a counter signal generator configurable to provide a time-varying, multi-bit counter signal; and a reference signal generator configurable to provide a reference signal maintainable at a first value, and further configurable to vary the reference signal over time from the first value to a second value, wherein each storage element receives the counter signal, the first input node of the first circuit within each pixel is connected to the photosensor in the same pixel, the second input node of the first circuit within each pixel receives the reference signal, and each storage element is configured to latch the value of the multi-bit signal at the time that a comparison signal generated at the storage element's respective pixel transitions from a first value to a second value.

2. The image sensor of claim 1, wherein the feedback loop comprises a switch configured to open the feedback loop while minimizing non-uniform charge injection in the pixel array.

3. The image sensor of claim 2, wherein the switch comprises:

a first switching transistor coupled between the first input node and an intermediate node;

a second switching transistor coupled between the intermediate node and the output node; and another connection between the intermediate node and the first input node.

4. The image sensor of claim 3, wherein the first switching transistor is approximately one half the size of the second switching transistor.

5. The image sensor of claim 1, wherein each pixel further comprises:

a first inverter circuit connected to the output node; and a second inverter circuit connected to an output of the first inverter circuit and outputting a pixel output signal.

6. The image sensor of claim 5, wherein:

a first control signal having first and second values is provided to the first switching transistor of each pixel, the first control signal selectively having the first value when the first node is connected to the output node, and the second value otherwise; and a second control signal having first and second values is provided to the second switching transistor and to at least one of the first and second inverter circuits, the second control signal having the second value when the first control signal has the first value and first value when the first control signal has the second value, wherein at least one of the first and second inverters is configurable such that a designated pixel output signal value is generated whenever the second control signal has the second value.

7. The image sensor of claim 6, further comprising a controller configured to:

transmit the first control signal first value and the second control signal second value so as to connect, for each pixel of the plurality of pixels, the first input and output nodes of the first circuit;

cause the reference signal generator to generate the first reference signal value;

transmit the first control signal second value and the second control signal first value;

activate an illumination source;

deactivate the illumination source after a designated time interval;

cause the counter signal generator to begin transmitting the counter signal; and vary the reference signal over time from the first value to the second value.

8. The image sensor of claim 5, wherein the first circuit output node is directly connected to the first inverter input, and wherein the first circuit comprises:

a two transistor current mirror having first and second current paths;

a first sensing transistor located on the first path and having a junction connected to the first input node; and a second sensing transistor on the second path and having a junction connected to the second input node.

9. The image sensor of claim 1, wherein the reference signal generator is configurable to linearly vary the reference signal over time from the first reference signal value to the second reference signal value.

10. The image sensor of claims 9, wherein the reference signal generator is located on the integrated circuit.

11. The image sensor of claim 9, wherein the reference signal generator comprises a Digital to Analog Converter.

12. The image sensor of claim 1, wherein the photosensor is a photodiode.

13. The image sensor of claim 1, wherein the multi-bit storage elements are located on the integrated circuit.

14. The image sensor of claim 1, wherein the counter signal is a gray code.

15. A computer input device for generating a cursor movement on a computer display in response to a corresponding movement of a surface relative to the input device, comprising:

an illumination source positioned to illuminate the relatively moving surface;

an image sensor positioned to receive reflected illumination from the relatively moving surface, the image sensor having a pixel array, the pixel array being located on a first portion of an integrated circuit and having a plurality of pixels, each pixel having:

a photosensor having an electrical property which varies in response to intensity of illumination, a first circuit switchable between operation as a comparator and as an op amp, the first circuit having first and second input nodes and an output node, and being configurable to generate a comparison signal at the output node in response to signals applied to the first and second input nodes, and feedback loop for selectively connecting the first input node and the output node so as to switch the first circuit between operation as an op amp and as a comparator;

a plurality of multi-bit storage elements displaced from the first portion of the integrated circuit, each of the storage elements connected to a respective one of the plurality of pixels, such that a separate storage element in the plurality is connected to each pixel;

a counter signal generator configurable to provide a time-varying, multi-bit counter signal; and a reference signal generator configurable to provide a reference signal maintainable at a first value, and further configurable to vary the reference signal over time from the first value to a second value, wherein each storage element receives the counter signal, the first input node of the first circuit within each pixel is connected to the photosensor in the same pixel, the second input node of the first circuit within each pixel receives the reference signal, and each storage element is configured to latch the value of the multi-bit signal at the time that a comparison signal generated at the storage element's respective pixel transitions from a first value to a second value.

16. The computer input device of claim 15, wherein the feedback loop comprises a switch configured to open the feedback loop while minimizing non-uniform charge injection in the pixel array.

17. The computer input device of claim 16, wherein the switch comprises:

a first switching transistor coupled between the first input node and an intermediate node;

a second switching transistor coupled between the intermediate node and the output node; and another connection between the intermediate node and the first input node.

18. The computer input device of claim 17, wherein the first switching transistor is approximately one half the size of the second switching transistor.

19. The computer input device of claim 15, wherein each pixel further comprises:

a first inverter circuit connected to the output node; and a second inverter circuit connected to an output of the first inverter circuit and outputting a pixel output signal.

20. The computer input device of claim 19, wherein:

a first control signal having first and second values is provided to the first switching transistor of each pixel, the first control signal selectively having the first value when the first node is connected to the output node, and the second value otherwise; and a second control signal having first and second values is provided to the second switching transistor and to at least one of the first and second inverter circuits, the second control signal having the second value when the first control signal has the first value and first value when the first control signal has the second value, wherein at least one of the first and second inverters is configurable such that a designated pixel output signal value is generated whenever the second control signal has the second value.

21. The computer input device of claim 20, further comprising a controller configured to:

transmit the first control signal first value and the second control signal second value so as to connect, for each pixel of the plurality of pixels, the first input and output nodes of the first circuit;

cause the reference signal generator to generate the first reference signal value;

transmit the first control signal second value and the second control signal first value; activate an illumination source;

deactivate the illumination source after a designated time interval;

cause the counter signal generator to begin transmitting the counter signal; and vary the reference signal over time from the first value to the second value.

22. The computer input device of claim 19, wherein the first circuit output node is directly connected to the first inverter input, and wherein the first circuit comprises:

a two transistor current mirror having first and second current paths;

a first sensing transistor located on the first path and having a junction connected to the first input node; and a second sensing transistor on the second path and having a junction connected to the second input node.

23. The computer input device of claim 15, wherein the reference signal generator is configurable to linearly vary the reference signal over time from the first reference signal value to the second reference signal value.

24. The computer input device of claim 23, wherein the reference signal generator is located on the integrated circuit.

25. The computer input device of claim 23, wherein the reference signal generator comprises a Digital to Analog Counter.

26. The computer input device of claim 15, wherein the photosensor is a photodiode.

27. The computer input device of claim 15, wherein the multibit storage elements are located on the integrated circuit.

28. The computer input device of claim 15, wherein the counter signal is a gray code.

* * * * *